United States Patent [19]

Fenner et al.

[11] Patent Number: 4,916,716
[45] Date of Patent: Apr. 10, 1990

[54] VARACTOR DIODE

[75] Inventors: Gunther Fenner, Nashua, N.H.; Klaus Gillessen, Untergruppenbach; Erhard Kohn, Leingarten, both of Fed. Rep. of Germany

[73] Assignee: Telefunken Electronic GmbH, Heilbronn, Fed. Rep. of Germany

[21] Appl. No.: 233,956

[22] Filed: Feb. 12, 1981

[30] Foreign Application Priority Data

Feb. 13, 1980 [DE] Fed. Rep. of Germany ....... 3005301

[51] Int. Cl.⁴ ............................................. H01L 29/48
[52] U.S. Cl. ........................................ 357/15; 357/52; 357/56; 357/71; 357/73
[58] Field of Search ...................... 357/14, 15, 52, 53, 357/56, 71, 73

[56] References Cited

U.S. PATENT DOCUMENTS

| 2,790,941 | 4/1957 | Dawson | 357/73 |
| 2,954,486 | 9/1960 | Doucette et al. | 357/52 |
| 3,264,712 | 8/1966 | Hayashi et al. | 357/73 |
| 3,280,382 | 10/1966 | Bendig | 357/73 |
| 3,363,150 | 1/1968 | Whitman et al. | 357/73 |
| 3,442,993 | 5/1969 | Yamamoto et al. | 357/73 |
| 3,469,156 | 9/1969 | Boerema et al. | 357/73 |
| 3,476,984 | 11/1969 | Tibol | 357/15 |
| 3,493,405 | 2/1970 | Thomas | 357/73 |
| 3,520,720 | 7/1970 | Saia et al. | 357/73 |
| 3,541,403 | 11/1970 | Lepselter et al. | 357/56 |
| 3,596,136 | 7/1971 | Fischer | 357/73 |
| 3,597,665 | 8/1971 | Quetsch et al. | 357/73 |
| 3,631,589 | 1/1972 | Garceau | 357/73 |
| 3,657,615 | 4/1972 | Driver | 357/15 |
| 3,676,668 | 7/1972 | Collins et al. | 357/73 |
| 3,731,159 | 5/1973 | McCann | 357/73 |
| 3,755,720 | 8/1973 | Kern | 357/73 |
| 3,834,883 | 9/1974 | Klein | 357/73 |
| 3,844,029 | 10/1974 | Dibugnara | 357/73 |
| 3,858,304 | 1/1975 | Leedy et al. | 357/15 |
| 4,017,340 | 4/1977 | Yerman | 357/73 |
| 4,059,837 | 11/1977 | Suzuki et al. | 357/71 |
| 4,142,202 | 2/1979 | Csillag et al. | 357/73 |
| 4,148,056 | 4/1979 | Matsunaga et al. | 357/73 |
| 4,168,960 | 9/1979 | Yoldas | 357/73 |
| 4,212,022 | 7/1980 | Beneking | 357/56 |
| 4,263,605 | 4/1981 | Christou et al. | 357/71 |
| 4,267,012 | 5/1981 | Pierce et al. | 357/71 |
| 4,321,612 | 3/1982 | Murata et al. | 357/15 |
| 4,321,617 | 3/1982 | Duda et al. | 357/71 |

FOREIGN PATENT DOCUMENTS

| 1514070 | 5/1972 | Fed. Rep. of Germany . |
| 2264126 | 7/1973 | Fed. Rep. of Germany . |
| 2437197 | 2/1975 | Fed. Rep. of Germany . |
| 2436449 | 4/1977 | Fed. Rep. of Germany . |
| 54-22779 | 2/1979 | Japan | 357/56 |

OTHER PUBLICATIONS

J. Calviello et al., "Novel GaAs Met. Diode . . . High Freq.", Electronics Letters, vol. 12 & 24, Nov. 25, 1976, pp. 648-650.
J. Sokolov et al., "A 4W, 56db Gain, IMPATT Diodes", 1979, IEEE MTT-S Int. Microwave Symp. Orlando, Fla., Apr. 30-May 2, 1979, pp. 489-491.

Primary Examiner—Joseph E. Clawson, Jr.
Attorney, Agent, or Firm—Spencer & Frank

[57] ABSTRACT

A varactor diode comprising a semiconductor element, with a pn-junction barrier layer or rectifying metal semiconductor junction on one outer face, an ohmic substrate contact on the opposite outer face and a glass casing in which the diode is hermetically sealed.

15 Claims, 2 Drawing Sheets

VARACTOR DIODE

BACKGROUND OF THE INVENTION

The invention relates to a varactor diode comprising a compound semiconductor connector element which has a pn-junction forming a barrier layer or a rectifying metal semiconductor junction (Schottky contact) on one outer face and has an ohmic substrate contact on the outer face of the semiconductor element opposite the barrier layer.

This type of semiconductor arrangement is known for exammple from "1979 IEEE International Solid State Circuits Conference", pages 120 to 121.

For applications on tuners, for example VHF and UHF television tuners, high-quality diodes which vary the capacitance are required having a fixed capacitance characteristic curve over the applied voltage with the posibility of the very great variation in capacitance. In order to achieve high quality, the diode must have a very small series resistance. This series resistance substantially comprises the resistance of the expitaxial layer contained in the semiconductor arrangement and the discharge resistance.

Known gallium arsenide Schottky contacts have a resistance to temperature of approximately 450° C. Consequently, these diodes are cast in plastics or hermetically sealed in ceramic casings.

SUMMARY OF THE INVENTION

It is an object of the invention to provide a varactor diode which is incorporated in a casing with the aid of a simple and low-cost construction technique.

According to a first aspect of the invention, there is provided a varactor diode comprising a compound semiconductor element, a pn-junction barrier layer or rectifying metal semiconductor junction on one outer face of said semiconductor element, an ohmic substrate contact on an outer face of said semiconductor element away from said barrier layer or junction and a glass casing in which said diode is hermetically sealed.

According to a second aspect of the invention, there is provided a varactor diode comprising a semiconductor element which has a pn-junction forming a barrier layer or a rectifying metal semiconductor junction on one outer face and has an ohmic substrate contact on the outer face of said semiconductor element opposite said barrier layer, wherein the diode is hermetically sealed in a glass casing and a material is chosen for the contacts of the diode which withstands the temperatures due to forming when incorporating the diode in the glass casing.

BRIEF DESCRIPTION OF THE DRAWINGS

The invention will now be described in greater detail, by way of an example, with reference to the drawings, in which.

DESCRIPTION OF THE PREFERRED EMBODIMENT

Basically the invention proposes a varactor diode of the type described at the outset which is hermetically sealed in a glass casing, the material of the contacts of the diode being selected to withstand the forming temperature during insertion of the diode into the glass casing.

These are preferably varactor diodes comprising a gallium arsenide semiconductor element, which is a typical compound semiconductor element. The Schottky contact comprises a temperature-resistant material or a combination of layers in which, starting from the semiconductor element, the layer sequences: tungsten/platinum/tungsten or titanium/tungsten are preferred. The Schottky contact may also comprise molybdenum. These contact materials or combinations of layers withstand the forming or fusing temperatures which occur during insertion of the Schottky diode into a glass casing, these temperatures being 600° C. or over.

A thick silver contact is applied to the Schottky contact, preferably electrolytically, which has the advantage that is not mixable with many metals. (Silver or molybdenium and silver or tungsten cannot be dissolved in each other.) The preferred contacts which form the barrier layer consists of the following:

n-GaAs/tungsten/platinum/tungsten/silver
n-GaAs/titanium/tungsten/silver
n-GaAs/molybdenum/silver The Schottky diode is preferably so arranged between two metal pressure bodies that, in each case, one diode contact is in connection with one connecting pressure body. Thereafter, the whole arrangement of connecting pressure bodies and diode is fused into a capillary glass tube out of which the electrode leads connected to the connecting pressure bodies project. In the case of Schottky diodes incorporated in glass casings what has been found to be particularly suitable are diodes those in which the semiconductor element is in mesa form, and in which the substrate contact extends over the side faces of the semiconductor element as far as the upper face provided with the barrier layer on the mesa elevation and terminates there at a small spacing from the barrier layer. The substrate contact on the side faces and on the upper face of the semiconductor element provided with the barrier layer is covered by a glass passivating layer.

Figure 1:
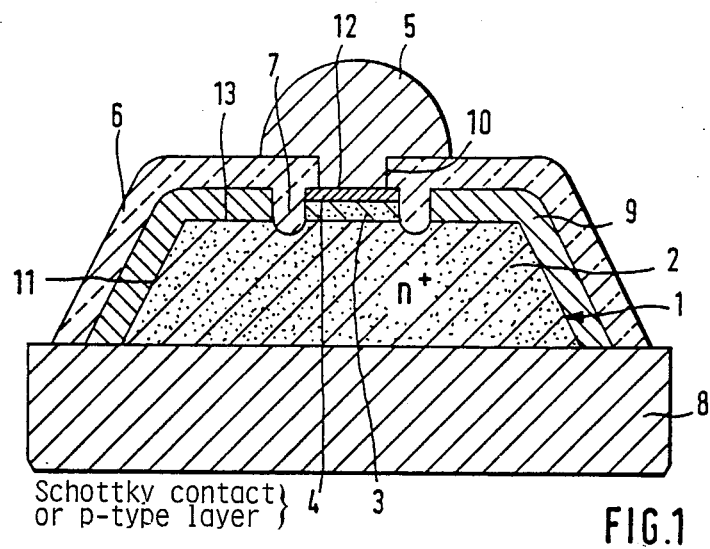
FIG. 1 shows in section, a varactor diode suitable for incorporation in a glass casing.
Figure 2:
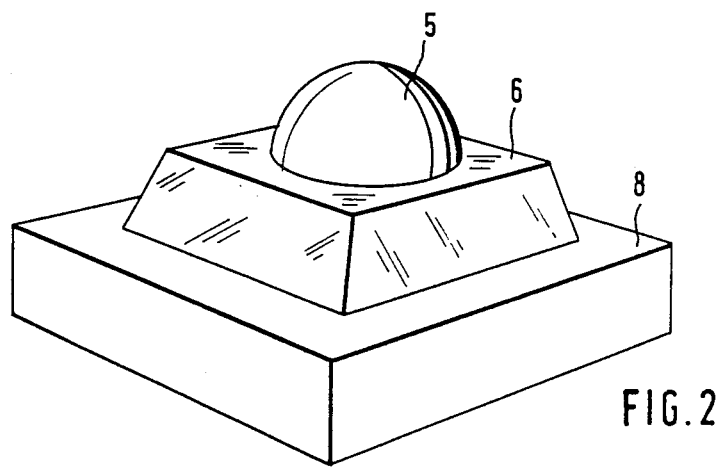
FIG. 2 is a perspective external view of the component shown in FIG. 1.

Referring now to the drawings, FIG. 1 shows a mesaform semiconductor element 1 which for example comprises n+-conductive gallium arsenide. The semiconductor element is mesa-shaped and therefore has side faces 11 which are angled in relation to the base. These angled side faces which give the semiconductor element the shape of a truncated pyramid can be seen from the perspective view of FIG. 2.

The semiconductor element 1 has a thickness of 30 to 70 μm for example. On the upper face 13 of the semiconductor element there is a relatively small remaining region 3 of a layer which has been weakly doped and produced by means of epitaxy. In the case of the n+-conductive base element this epitaxial layer 3 is weakly n-conductive and is approximately 0.2 to 2 μm in thickness. The epitaxial layer 3 only covers a small part of the upper face 13 of the semiconductor element in the embodiment shown in FIG. 1 and is separated by an annular channel 7 from and extension of rear face contact 9 on the upper face 13 of the semiconductor. The channel 7 may also be replaced by an insulating guard ring preventing electrical breakdown. These guard rings are produced for example by means of ion implantation of oxygen ions or chromium ions, while the Schottky contact serves as an implantation mask. The epitaxial layer 3 is covered by a contact 4. In the case of a Schottky diode, contact 4 is a metal body having the form described above; in the case of a diode having a pn-junction, contact 4 is a layer of p-type meterial. Hereafter, reference will be made to the Schottky diode embodiment.

A rear face contact 8 on the semiconductor substrate 2 preferably comprises silver and has an extension which extends over the side faces 11 of the semiconductor element as far as the opposite upper face and terminates close to the barrier layer or directly at the channel 7 or a corresponding guard ring. This extension of the contact 9 comprises gold-germanium for example and is approximately 2 to 5 μm thick.

Starting from the n-conductive gallium arsenide base body, the Schottky contact 4 comprises a 0.1 μm thick layer of tungsten, a 0.3 μm thick layer of platinum and a layer of tungsten covering the layer of platinum and also 0.1 μm thick. These layers are vapour-deposited at approximately 90° C., preferably in a vacuum chamber. In the case of another embodiment, the first layer applied to the semiconductor element comprises tungsten and has a thickness of approximately 0.2 μm or comprises a titanium/tungsten alloy of the same thickness. In the latter case, the alloy comprises 10% titanium and 90% tungsten for example. A further layer of platinum having a thickness of 0.3 μm is vapour-deposited on to this first layer.

The side faces of the mesa-shaped semiconductor element and the upper face provided with the barrier layer are covered finally with a 1 to 5 μm thick passivating layer of glass 6 into which an opening 10 is formed, with the aid of the known masking and etching technique over the Schottky contact 4. The connection with the Schottky contact 4 is produced in this opening. This connection comprises a silver elevation 5 for example which bears against the upper surface 12 of contact 4 and which has a mushroom-like shape and extends through the opening 10 and over parts of the passivating layer 6 of glass.

Figure 3:
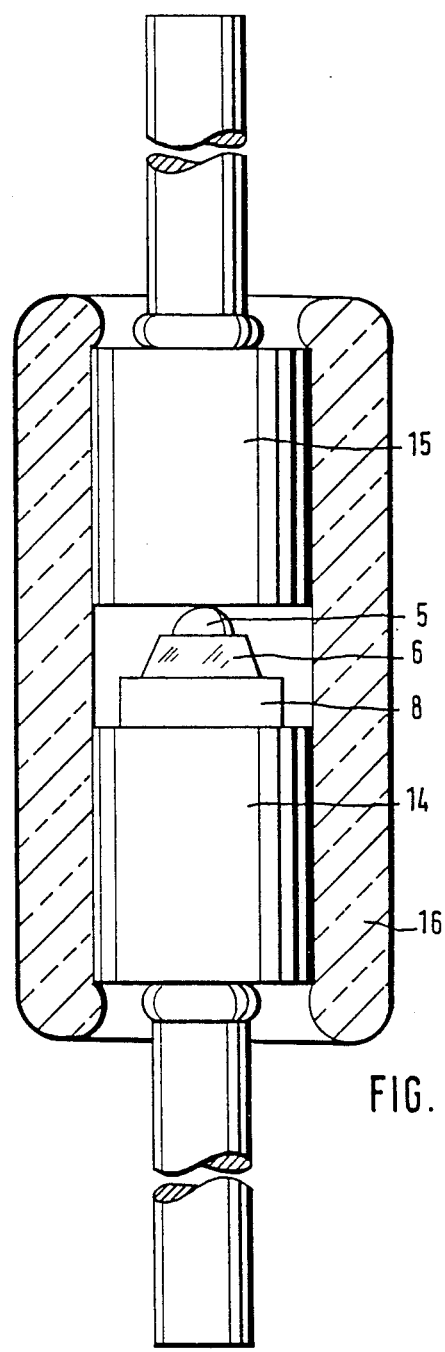
FIG. 3 shows a varactor diode fused into the glass casing.

The varactor diode shown in FIGS., 1 and 2 is incorporated in a glass casing in accordance with FIG. 3. This casing comprises two metal pressure bodies 14,15, for example comprising iron with a copper envelope between which the varactor diode is so arranged that the rear face contact 8 is in electrically conductive and direct connection with the pressure body 14 as is connecting contact 5 with pressure body 15. The overall arrangement of connecting pressure bodies 14,15 and the semiconductor component is finally fused into a capillary glass tube 16 in which the fusion temperature is approximately 600° to 650° C. The invention provides a varactor diode which in the first instance may be fused into a glass casing of this type known from other diode techniques. During fusion or while forming the glass casing the semiconductor component is hermetically encapsulated. At the same time the glass shrinks and the metal pressure bodies form a low-resistance connection with the physical contacts of the semiconductor component both on the front and rear faces of the semiconductor element.

It will be understood that the above description of the present invention is susceptible to various modification changes and adaptations.

What is claimed is:

1. An encased varactor diode comprising: a compound semiconductor element which has a rectifying metal semiconductor junction on a first outer face and an ohmic substrate contact on a second outer face of said semiconductor element which is opposite said first outer face; and a glass casing in which said diode is hermetically sealed, with said diode having contacts made of a material which withstands the temperature due to forming when the diode is sealed into said glass casing; the improvement wherein: said semiconductor element is mesa shaped; said substrate contact extends completely over side faces of the said semiconductor element onto said first outer face and ends at a small spacing from said junction; said substrate contact on the side faces and on said first outer face of said semiconductor element is covered by a glass passivating layer; said diode is arranged between two metal pressure bodies with each diode contact being in pressure contact with a respective said pressure body; and the overall arrangement of said pressure bodies and said diode are enclosed in a glass capillary tube which is fused to said pressure bodies and out of which project electrode leads which are connected to said pressure bodies.

2. A varactor diode as defined in claim 1, wherein said semiconductor element comprises gallium arsenide.

3. A varactor diode as defined in claim 1, wherein said junction is a Schottky contact comprising a layer sequence of tungsten/platinum/tungsten or titanium/tungsten, starting from said semiconductor element.

4. A varactor diode as defined in claim 3, wherein said Schottky contact is covered by a layer of silver.

5. A varactor diode as defined in claim 1, wherein said junction is a Schottky contact comprising molybdenum.

6. A varactor diode as defined in claim 5, wherein said Schottky contact is covered by a layer of silver.

7. A varactor diode as defined in claim 1, wherein said junction is a Schottky contact, comprising a silver contact in connection with said Schottky contact and having a shape projecting mushroom-like over said glass passivating layer.

8. In an encased varactor diode comprising: a compound semiconductor element which has a pn-junction forming a barrier layer on a first outer face, or ohmic diode contact on said first outer face, and an ohmic substrate contact on a second outer face of said semiconductor element which is opposite said first outer face; and a glass casing in which said diode is hermetically sealed, with said diode having contacts made of a material which withstands the temperature due to forming when the diode is sealed into said glass casing; the improvement wherein: said semiconductor element is mesa shaped; said substrate contact extends over side faces of the said semiconductor element onto said first outer face and ends at a small spacing from said barrier layer; said substrate contact on the side faces and on said first outer face of said semiconductor element is covered by a glass passivating layer; said diode is arranged between two metal pressure bodies with each diode contact being in pressure contact with a respective said pressure body; and the overall arrangement of said pressure bodies and said diode are enclosed in a glass capillary tube which is fused to said pressure bodies and out of which project electrode leads which are connected to said pressure bodies.

9. A varactor diode as defined in claim 1 wherein the fusion temperature for the glass material of said capillary tube is at least approximately 600° C.

10. A varactor diode as defined in claim 8 wherein the fusion temperature for the glass material of said capillary tube is at least approximately 600° C.

11. In an encapsulated varactor diode comprising:
a semiconductor substrate body; means forming a rectifying junction with the semiconductor body on a first outer surface of said body; a first diode contact on said first outer surface and ohmically contacting said means; a second diode substrate contact ohmically contacting the semiconductor body on a second outer surface which is opposite said first outer surface; and a glass casing hermetically encapsulating said diode and from which electrodes connected to said diode contacts extend; the improvement wherein: said semiconductor body is formed of gallium arsenide and is mesa shaped with inclined side surfaces; said second diode contact extends completely over said side surfaces onto said first outer surface and ends at a small spacing from said junction; said glass casing is formed of a glass having a relatively high fusion temperature of at least 600° C.; and said diode contacts are formed of a material which withstands the fusion temperature used to encapsulate said diode in said glass housing.

12. A encapsulated varactor diode as defined in claim 11 further comprising first and second metal pressure bodies disposed respectively adjacent said first and second outer surfaces and pressure contacting said first and second diode contacts respectively; and wherein said glass casing comprises a glass capillary tube which encloses said pressure bodies and said semiconductor body and which is fused to said pressure bodies, and said electrodes are connected to said pressure bodies.

13. An encapsulated varactor diode as defined in claim 12, further comprising a glass passivating layer covering said second diode contact on said side surfaces and on said first outer surface.

14. A varactor diode as defined in claim 8 wherein said semiconductor element comprises gallium arsenide.

15. A varactor diode as defined in claim 8, comprising a silver contact in connection with said junction and having a shape projecting mushroom-like over said glass passivating layer.

* * * * *